(12) United States Patent
Tikka et al.

(10) Patent No.: US 7,187,109 B2
(45) Date of Patent: Mar. 6, 2007

(54) ELECTRICAL COMPONENT HAVING OVERLAPPING ELECTRODES, AND METHOD FOR THE MANUFACTURE OF SAME

(75) Inventors: Pasi Tikka, Taufkirchen (DE); Ralph Stömmer, Neubiberg (DE); Edgar Schmidhammer, Stein (DE); Habbo Heinze, Unterschleissheim (DE)

(73) Assignee: Epcos AG, Munich (DE)

( * ) Notice: Subject to any disclaimer, the term of this patent is extended or adjusted under 35 U.S.C. 154(b) by 254 days.

(21) Appl. No.: 10/900,515

(22) Filed: Jul. 28, 2004

(65) Prior Publication Data

US 2005/0082951 A1 Apr. 21, 2005

(30) Foreign Application Priority Data

Aug. 1, 2003 (DE) .................. 103 35 331

(51) Int. Cl.
*H01L 41/08* (2006.01)
(52) U.S. Cl. .................. 310/365; 310/366
(58) Field of Classification Search ........ 310/365, 310/366
See application file for complete search history.

(56) References Cited

U.S. PATENT DOCUMENTS

| 3,365,400 | A | * | 1/1968 | Pulvari | .............. 252/62.9 R |
| 4,469,976 | A | * | 9/1984 | Scott | .............. 310/334 |
| 4,583,018 | A | * | 4/1986 | Izumi et al. | .............. 310/334 |
| 5,894,647 | A | | 4/1999 | Lakin | |
| 5,942,958 | A | | 8/1999 | Lakin | |
| 6,577,043 | B2 | * | 6/2003 | Tsukai et al. | .............. 310/320 |
| 6,903,496 | B2 | * | 6/2005 | Takeuchi et al. | .............. 310/363 |

\* cited by examiner

*Primary Examiner*—Mark Budd
(74) *Attorney, Agent, or Firm*—Schiff Hardin LLP (57) ABSTRACT

Overlapped electrodes of an electrical component are dimensioned in such a way that when there is translational displacement of one electrode in relation to the electrode situated opposite, their area of overlap remains within a manufacturing tolerance β/2, and also remains constant within the tolerance limits when there is a simultaneous rotation of the electrodes with respect to one another. This is achieved in that the intersecting edge pairs of the overlapping electrodes are designed parallel to one another, whereby the length, measured in the direction parallel to the respective edge pair, of the corresponding electrode everywhere exceeds by β the corresponding length of the area of overlap.

13 Claims, 12 Drawing Sheets

ELECTRICAL COMPONENT HAVING OVERLAPPING ELECTRODES, AND METHOD FOR THE MANUFACTURE OF SAME

BACKGROUND

The present disclosure relates to an electrical component having overlapping electrodes, for example a capacitor or a bulk oscillator, in particular a thin-film resonator or FBAR (Thin Film Bulk Acoustic Wave Resonator).

The electrodes, situated one over the other, of a thin-film resonator are produced in metal layers, for example in an exposure method using exposure masks. The areas of the electrodes that lie exactly one over the other define through their area of overlap an active surface, that is, a surface that is of decisive importance for the electrical characteristics of the component. Errors in adjustment in the placement of the mask result in manufacturing-related scatter losses of the active surface, and, in particular in filter applications, to a resulting worsening of the electrical characteristics.

Unintentional overlappings of the electrodes of a thin-film resonator result in parasitic resonators through the piezoelectric layer situated therebetween, whose admittance curves (frequency response curve of the admittance) are shifted against the admittance curve of the original resonator. The parasitic resonators are connected parallel to the original resonator (main resonator) and thus have an adverse effect on its bandwidth and quality. For example, a parasitic resonator whose surface is only 0.002% of the surface of the main resonator, and whose parasitic resonance is close to the anti-resonance of the main resonator, reduces the quality of the main resonator in the area of the anti-resonance by approximately 50%.

For example, for resonator and filter applications in the frequency range between 500 MHz and 5 GHz, a resonator surface of 200 µm×200 µm is typically used. An adjustment error of the masks, resulting in a mutual shifting of the electrodes, whose side length is 200 µm, by only 0.4 µm results in a reduction of the resonator quality to one-half of the ideal value.

In a bandpass filter, a reduced quality of the resonators results in a low edge steepness in the passband of the transmission function. The edge steepness is thereby decisive for the fulfilling of the specifications in filter applications, in which the passband and the rejection bands or blocking-state regions are very close to one another in terms of frequency. In addition, the reduction of the resonator quality also results in an increased insertion loss and a reduced bandwidth.

Up to now, mask adjustment errors were removed for example by the later removal of errored regions (see the reference U.S. Pat. No. 5,894,647). However, this solution has the disadvantage that an additional method step is required, which increases the processing time.

It is also possible to design one of the electrodes to be larger, taking into account the tolerance shifts. However, in this case the alteration of the overlapping surface, with the shift of the corresponding electrical supply line or conductor cannot be compensated. Moreover, parasitic capacitances of the component are thereby increased.

Another possibility for avoiding the tolerance errors in thin-film resonators is to use high-precision mask positioning in the lithography. For example, in contact lithography the precision of positioning is approximately ±1.0 µm, in thin-film stepper lithography it is approximately ±0.1 µm, and with the most modern step-scan systems it is approximately ±0.01 µm. However, the use of such devices results in a considerable increase in the processing costs, and can, for example in DRAM manufacturing, account for up to 50% of the overall process costs.

SUMMARY

It is an object to provide an electrical component having electrodes situated one over the other having an improved adjustment tolerance, or having electrical characteristics that are reproducible to a high degree, as well as a method for the manufacture thereof.

According to at least one embodiment of the present system and method, an electrical component has a number N of first electrodes and the number N of second electrodes allocated to and situated above the first electrodes. One of the first electrode and the second electrode allocated to the one first electrode respectively forms together an electrode pair that comprises an area of overlap. In each first electrode at least two edges situated opposite one another form a first edge pair. In each second electrode at least two edges situated opposite one another form a second edge pair. The first and second edge pairs cross in areas of crossing. For all N electrode pairs at least in the respective area of crossing the edges of the first edge pair are oriented parallel to a first preferred direction and comprise parallel segments having a length L per segment. At least in the respective area of crossing the edges of the second edge pair are oriented parallel to a second preferred direction and comprise parallel segments having the length of L per segment. A surface of the area of overlap is invariable against a displacement of the two electrodes relative to one another by an amount $\geq \beta$. Along each line parallel to the first preferred direction and parallel to the second preferred direction the following holds $|L-L'| \geq \beta$, where $L'$ is the distance, measured in the respective direction, between the outer edges, situated opposite one another of the area of overlap, and $L$ is the distance, measured in the respective direction between the outer edges, situated opposite one another of the electrode extending beyond the area of overlap in the respective direction.

BRIEF DESCRIPTION OF THE DRAWINGS

FIG. 6b shows an explanation of the formation of the crossing areas of edge pairs in the exemplary embodiment according to FIG. 6a;

FIG. 10b shows the equivalent circuit corresponding to FIG. 10a.

DESCRIPTION OF THE PREFERRED EMBODIMENTS

For the purposes of promoting an understanding of the principles of the invention, reference will now be made to the preferred embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

The preferred embodiment indicates a component comprising, in a first metallic layer, a number N>2 of first electrodes, and, in a second metallic layer situated thereabove, the corresponding number of second electrodes.

In each first electrode, at least two edges situated opposite one another are designed to be at least partially parallel, and form a first edge pair. In each second electrode, at least two edges situated opposite one another are designed so as to be at least partially parallel, and form a second edge pair. The first and the second edge pair cross one another in crossing areas.

It is thereby the case for all N electrode pairs that the edges of the first edge pair are oriented parallel to a first preferred direction, at least in the respective area of crossing, and comprise parallel segments having a length L per segment. The edges of the second edge pair are, at least in the respective crossing area, oriented parallel to a second preferred direction, and comprise parallel segments having the length L per segment. Extended parallel segments of the first and of the second edge pair together form a parallelogram, whereby the parallel segments of the respective edge are situated along one side of the parallelogram.

Along each line, parallel to the first preferred direction and parallel to the second preferred direction, the condition $|L-L'| \geq \beta$ is fulfilled, where L' is the distance, measured in the respective direction, between the outer edges, situated opposite one another, of the area of overlap. L is the distance measured in this direction between the outer edges, situated opposite one another, of the electrode extending in this direction beyond the area of overlap.

The preferred embodiment has the advantage that, given a mutual shifting of the electrodes in one direction within the tolerance error (i.e., by a maximum of $\pm\beta/2$ in the X, Y direction), the overlap surface thereof remains unchanged even taking into account the electrical supply lines. The component is therefore insensitive in particular to translational adjustment errors, and in addition is also not sensitive to slight rotations of the exposure masks in relation to one another. It is thereby even possible to use processing means having a high degree of positional imprecision for the economical manufacturing of such a component.

Preferably, in particular in thin-film resonator applications, the length β, corresponding to the tolerance error, of the parallel segments of the electrode edges is selected equal to 0.4 μm. However, depending on the application it is also possible for β to be only 0.2 μm or 0.1 μm. It is also possible for β to be 1% or 2% of the corresponding length of the overlap area.

The angle between the first and the second preferred direction is preferably between 30° and 90°.

In the first specific embodiment, a single contiguous area of overlap is formed by the overlapping of the two electrodes.

In a further variant, at least one electrode of at least one of the electrode pairs comprises a plurality of partial electrodes or subelectrodes that are connected with one another and situated alongside one another, whereby at least one edge, allocated to the first or to the second edge pair, of each partial electrode intersects with at least one edge pair of the corresponding other electrode of this electrode pair. In this case, the area of overlap is made up of a plurality of partially overlapping areas, which are respectively contiguously formed and are connected electrically with one another, but which do not touch each other, formed respectively by a partial electrode and the other electrode situated directly above it.

Such partial areas of overlap are formed for example when a strip-shaped electrode overlaps with the limbs of a U-shaped, O-shaped, or E-shaped electrode. The inner edges, facing one another, of the partial electrodes (electrode limbs) connected with one another thereby form the first edge pair, having the above-cited indicated characteristics, and the edges, crossing these inner edges, of the other electrode form the second edge pair. In a variant (see FIG. 5b), the outer edges, situated opposite one another, of the area of overlap are formed by the edges, oriented essentially along the limb edges, of the respective other electrode. In a further variant (see FIG. 5a), the outer edges of the area of overlap are formed by the limb edges, facing away from one another, of the partial electrodes.

Thus, the condition $|L-L'| \geq \beta$ also holds for constructions having a plurality of areas of partial overlap.

Between the electrodes of an electrode pair there is provided an intermediate layer that is formed as a dielectric layer, for example air.

The dielectric layer is preferably a piezoelectric layer, whereby the respective area of overlap forms a resonator area of a thin-film resonator.

The intermediate layer can also comprise a plurality of sublayers that differ from one another.

In a method in which the first electrodes are produced in a first lithography step and the second electrodes are produced in a second lithography step, the lithography steps are adjusted to one another with a relative adjustment tolerance β. The advantage of the method is that the achieved tolerance is significantly smaller than β.

In the drawings, the schematic representations are not to scale, the parts that are identical or that have identical functions are designated with identical reference characters.

Figure 1A:
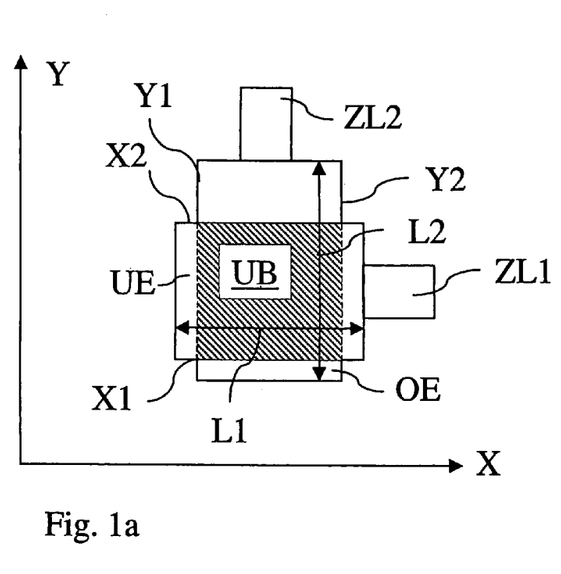
FIG. 1a shows a schematic top view of a component.

FIG. 1a shows a first specific embodiment having two overlapping rectangular electrodes UE (first electrode) and OE (second electrode situated above the first), in a schematic top view from above.

The first and the second electrodes UE and OE together form an electrode pair that has an area of overlap UB. Area of overlap UB is defined by the overlapping surface of the first electrode and of the second electrode projected onto the first electrode in the lateral plane.

The component comprises a plurality of electrode pairs, not shown here.

The first preferred direction X is selected along the parallel segment of the first edge pair. The second preferred direction Y is selected along the parallel segment of the second edge pair.

First electrode UE comprises, in particular, electrode edges X1 and X2 that are parallel to one another, and that are oriented along the X-axis (first preferred direction) and form a first edge pair. Second electrode OE comprises electrode edges Y1 and Y2 that are parallel to one another and that are oriented along the Y-axis (second preferred direction), and form a second edge pair. First edge pair X1, X2 and second edge pair Y1, Y2 cross one another, and thereby form the cited overlap area UB. The corresponding edges X1', X2', Y1', and Y2' of the area of overlap UB (see FIG. 1c) together form a parallelogram (here a rectangle).

The distance L2' between edges X1' and X2' of the parallelogram, measured along an arbitrary line in the Y direction, is thereby smaller by at least β than is the distance L2, measured along the same line, between the edges of second electrode OE, which extends beyond the area of overlap in this direction.

The distance L1' between the edges Y1' and Y2' of the parallelogram, measured along an arbitrary line in the X direction, is thereby smaller by at least β than is the distance L1, measured along the same line, between the edges of first electrode UE, which extends beyond the area of overlap in this direction.

ZL1 is a first supply line that electrically connects first electrode UE of the component structure shown in FIG. 1a with the first electrode of a component structure not shown here. ZL2 is a second supply line that electrically connects second electrode OE of the component structure shown in FIG. 1a with the second electrode of an additional component structure not shown here. Supply lines ZL1, ZL2 are connected to areas of the corresponding electrodes that are not adjacent to the area of overlap UB.

Figure 1B:
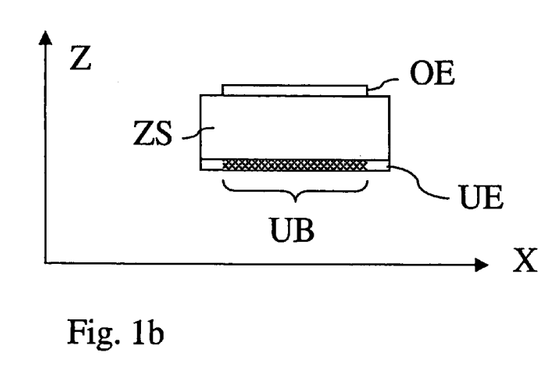
FIG. 1b shows the layer construction of the component according to FIG. 1a in a schematic cross-section.
Figure 1C:
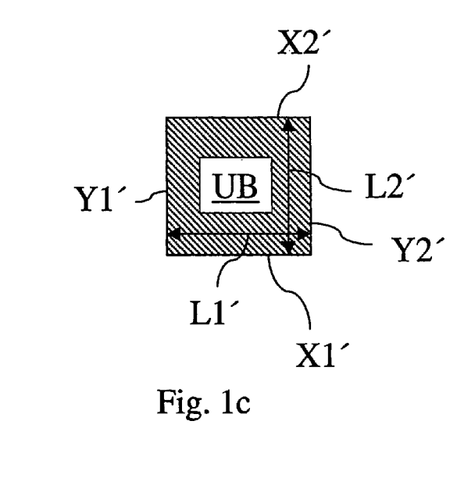
FIG. 1c shows the area of overlap of the component according to FIG. 1a in a schematic top view.

In FIG. 1b, the component according to FIG. 1a is shown in schematic cross-section in the Z,X plane. ZS is the dielectric or semiconducting intermediate layer.

Figure 2A:
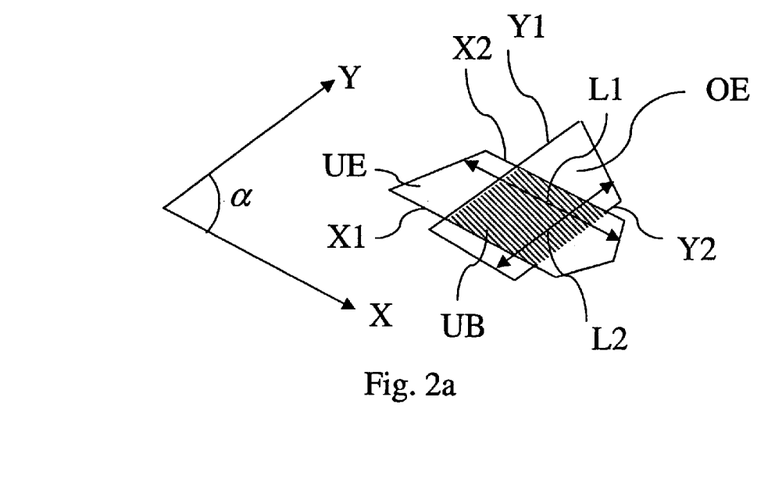
FIGS. 2a, 2c respectively show a component having edge pairs that are only partly provided so as to be parallel, in a schematic top view.
Figure 2B:
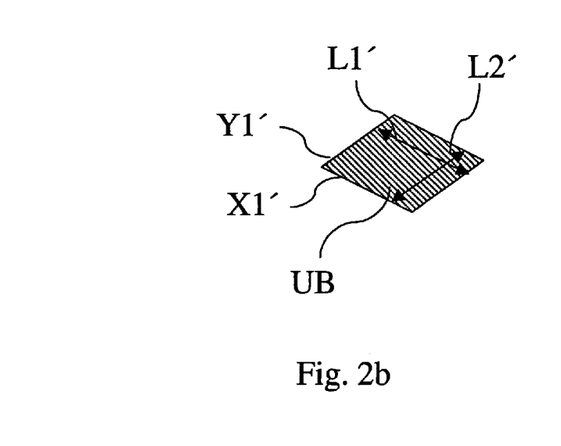
FIGS. 2b, 2d respectively show the area of overlap of the component according to FIG. 2a or 2c, in a schematic top view.

FIG. 2a shows a further specific embodiment whereby only the edges X1 and X2 (or Y1 and Y2) of the crossing edge pairs are designed parallel to one another. The area of overlap UB is shown in FIG. 2b. In this variant, the area of overlap forms a parallelogram. The distances, measured in the same X or Y direction, between the edges of the parallelogram and the electrode extending beyond them fulfill the conditions referred to in the description relating to FIG. 1a.

Figure 2C:
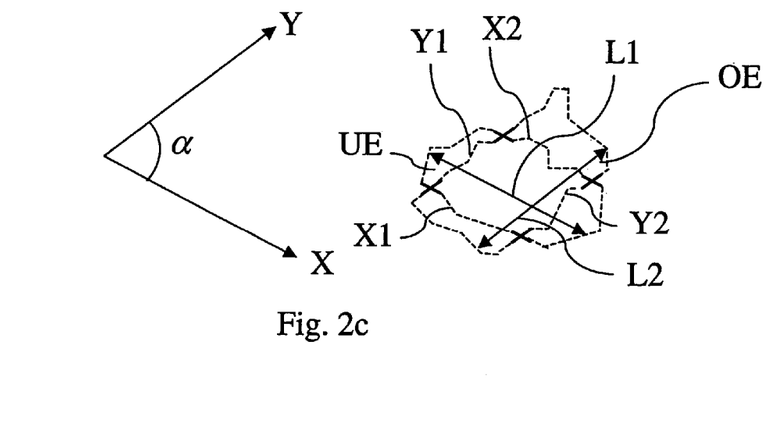

In FIG. 2c, a generalized construction of an electrode pair of the component is shown, in which each edge pair comprises mutually parallel segments of length L1 or L2 only in the area of crossing of a first edge pair (X1 and X2) with a respective edge Y1 or Y2 of the second edge pair, whereby the crossing edge pairs form an area of overlap UB of the two electrodes whose surface is invariable against a displacement of both edge pairs relative to one another by an amount ±β/2. The parallel segments lie along the sides of a parallelogram PG (see FIG. 2d).

Figure 2D:
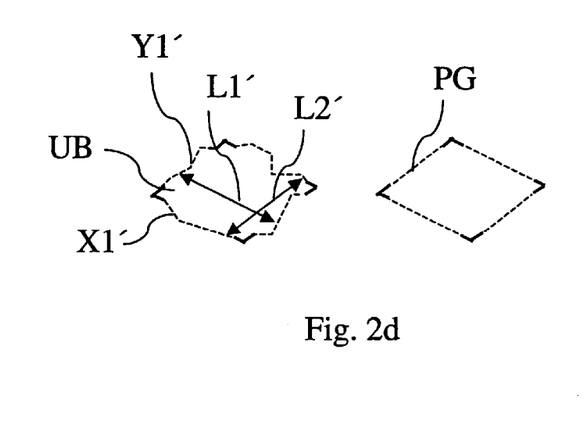
Figure 3A:
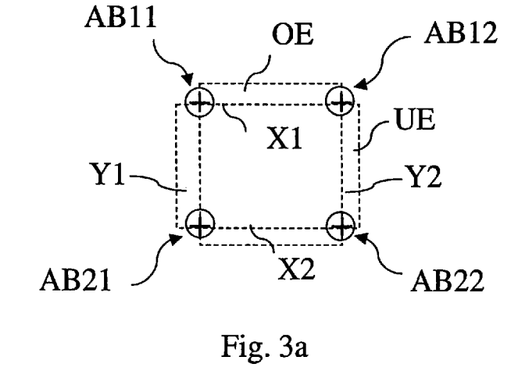
FIGS. 3a to 3e show explanations of the formation of the crossing areas of edge pairs with segments, formed in parallel, of the electrode edges, in a schematic top view.
Figure 3B:
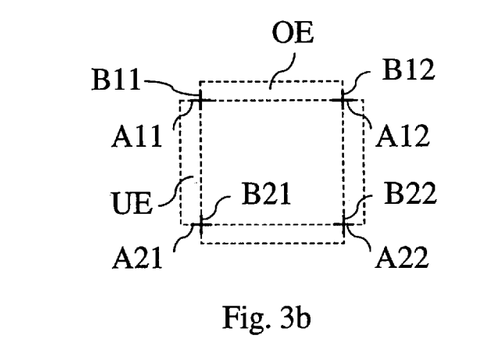
Figure 3C:
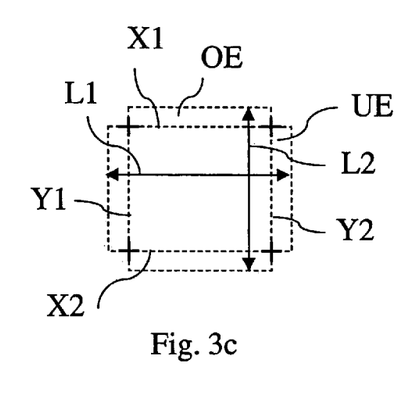
Figure 3D:
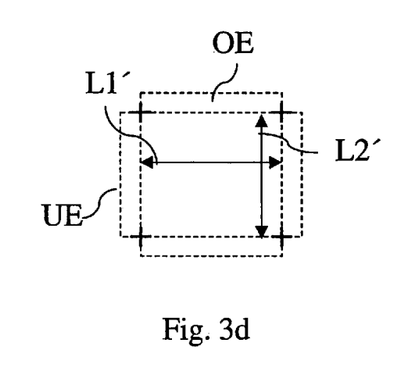
Figure 3E:
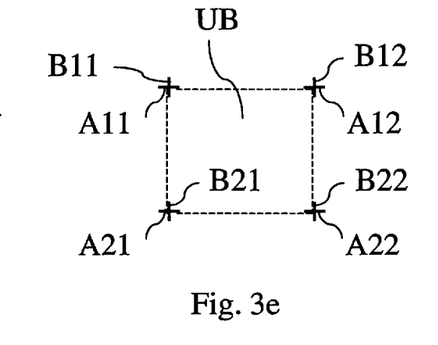

At the left in FIG. 2d, there is shown the area of overlap of the electrode pair according to FIG. 2c, and at the right there is shown the parallelogram PG spanned by the parallel segments.

In FIGS. 3a to 3e, the design of the electrode pair in areas of crossing AB11, AB12, AB21 and AB22 of the first and of the second edge pair is explained in detail. These areas are circled in FIG. 3a.

The broken lines correspond to the segments of the respective edge that can be shaped arbitrarily, whereby their form can deviate from a straight line.

Segments A11 and A12 of edge X1 on the one hand, and segments A21 and A22 of edge X2 on the other hand, are situated along the opposite sides of a parallelogram. Segments B11 and B12 of edge Y1 on the one hand, and segments B21 and B22 of edge Y2 on the other hand, lie along the opposite sides of the same parallelogram. Segments A11 to A22 and B11 to B22 each have length β.

The length L1 or L2 of the electrode extending beyond the area of overlap UB in the X or Y direction is always greater by at least β than is the length L1' or L2', measured in this direction, of the area of overlap UB.

Figure 4A:
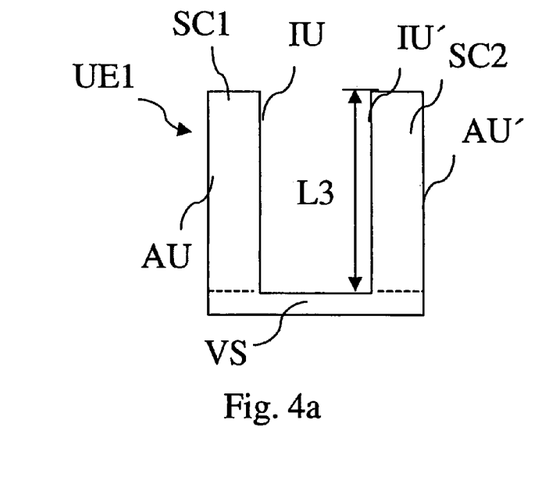
FIGS. 4a, 4b respectively show a U-shaped electrode in a schematic top view.

In FIG. 4a, there is shown a U-shaped electrode UE1 that overlaps with an additional electrode in the component. U-shaped electrode UE1 has two limbs SC1 and SC2 that form partial electrodes and that are designed essentially parallel to one another, and has a connecting piece VS that connects the partial electrodes and is here formed with a right angle. The electrode limbs have a length of L3. The electrode limbs comprise inner edges IU and IU' that face one another, and outer edges AU and AU' that face away from one another.

Figure 4B:
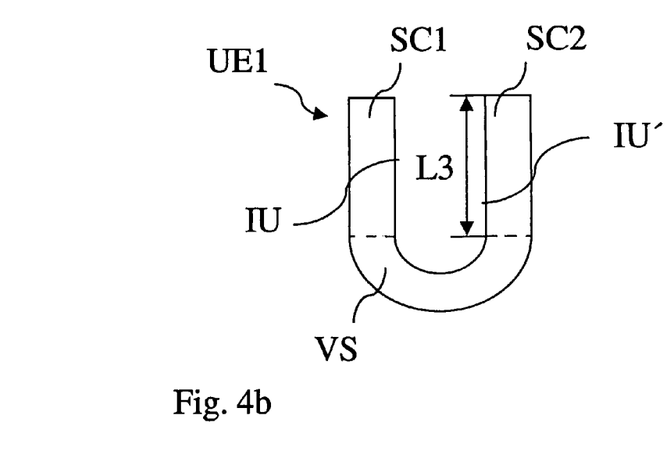

In FIG. 4b, a variant of the U-shaped electrode UE1 is shown having an arbitrarily shaped connecting piece VS.

Figure 4C:
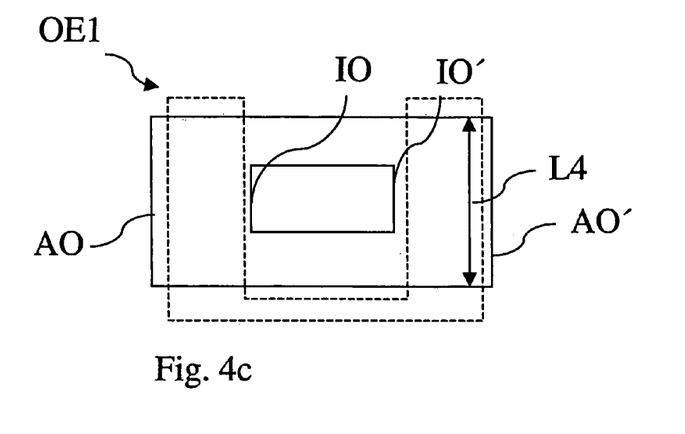
FIG. 4c shows an O-shaped electrode in a schematic top view.

FIG. 4c shows an O-shaped electrode OE1 that, in the component, preferably overlaps with a U-shaped electrode according to FIG. 4a or 4b. Inner edges IO and IO', situated opposite one another, which are essentially oriented parallel to the inner edges of the limbs of the U-shaped electrode, are preferably designed parallel to one another. Outer edges AO and AO', situated opposite one another, which are essentially oriented parallel to the outer edges of the limbs of the U-shaped electrode, are preferably designed parallel to one another. Reference character L4 designates the distance between the outer edges of electrode OE1 in the areas of partial overlap with the U-shaped electrode, which is indicated in the Figure with a broken line. The length L3 of the limb of the U-shaped electrode is greater by at least β than is length L4.

Figure 5A:
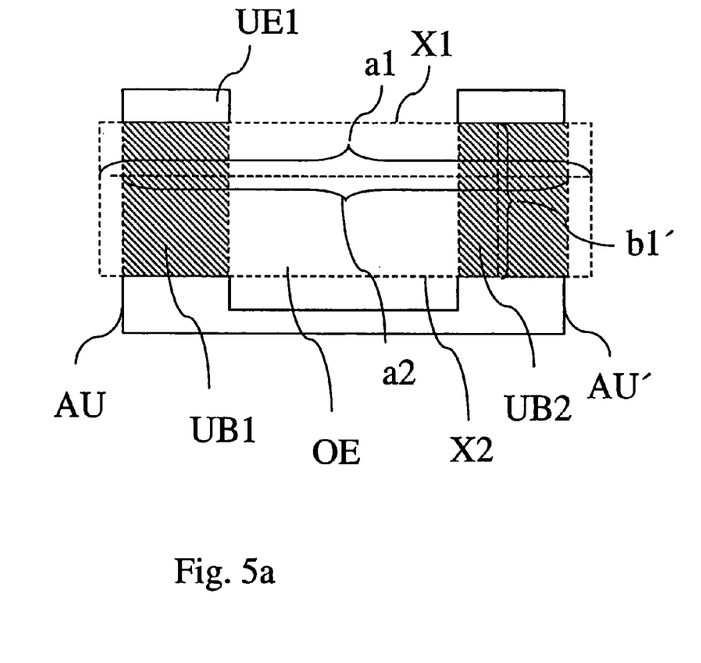
FIGS. 5a, 5b, 6a each show a U-shaped electrode that overlaps with a strip-shaped electrode, in a schematic top view.

FIG. 5a shows a U-shaped first electrode UE1 that overlaps with second electrode OE, which is strip-shaped. Here, the area of overlap is made up of two partial areas of overlap UB1 and UB2, which are separated from one another. The partial areas of overlap define two capacitors or resonators that are connected in parallel to one another.

The limbs of U-shaped electrode UE1 are essentially oriented along the Y-axis. Edge pair X1, X2 of second electrode OE (first edge pair) crosses on the one hand an edge pair of electrode UE1, which is formed by the inner edges of this electrode (second edge pair), and on the other hand an additional edge pair of this electrode, which is formed by its outer edges AU and AU' (additional second edge pair). The length L3 of the limb of the U-shaped electrode is greater by at least β than is the length b1', measured in the Y direction, of second electrode OE. Edges X1 and X2, oriented along the X-axis, comprise segments that are parallel at least in the areas of crossing (see also FIG. 6b). Distance a1, measured along each line in the X direction, between the outer edges, situated opposite one another, of second electrode OE, which in this exemplary embodiment extends outward past the edges of the areas of partial overlap, is greater by at least β than is distance a2, measured in this direction, between edges AU, AU', facing outward, of U-shaped first electrode UE1.

Figure 5B:
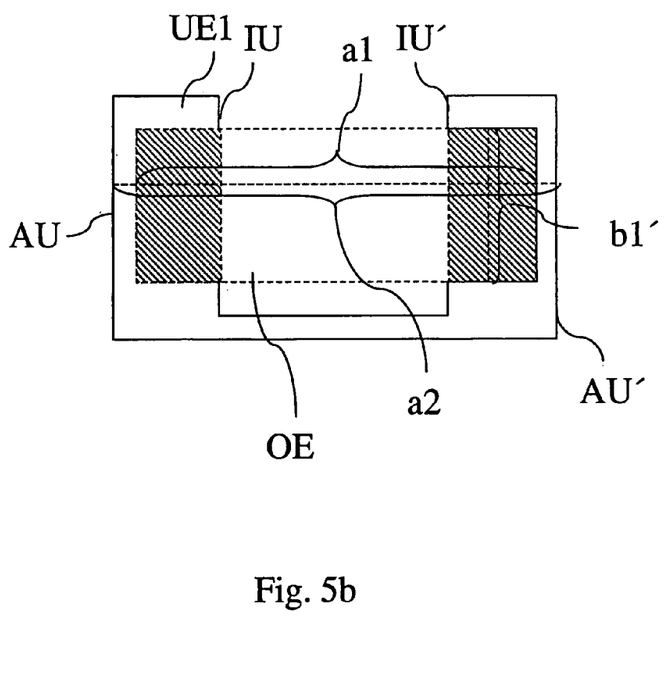

FIG. 5b presents a variant of the arrangement, already explained in FIG. 5a, of a strip-shaped electrode and a U-shaped electrode. In this variant, the edges of strip-shaped electrode OE intersect only a second edge pair that is formed by inner electrodes IU and IU' of U-shaped electrode UE1. Distance a1, measured along each line in the X direction, between the outer edges situated opposite one another of second electrode OE, is smaller by at least β than is distance a2, measured in this direction, between outward-facing edges AU, AU' of U-shaped first electrode UE1, which in this exemplary embodiment extends outward beyond the edges of the partial areas of overlap. Under this condition, the shape of the outer edges of the two electrodes, which outer edges are oriented essentially in the same direction (here the Y direction), can be chosen arbitrarily.

Figure 6A:
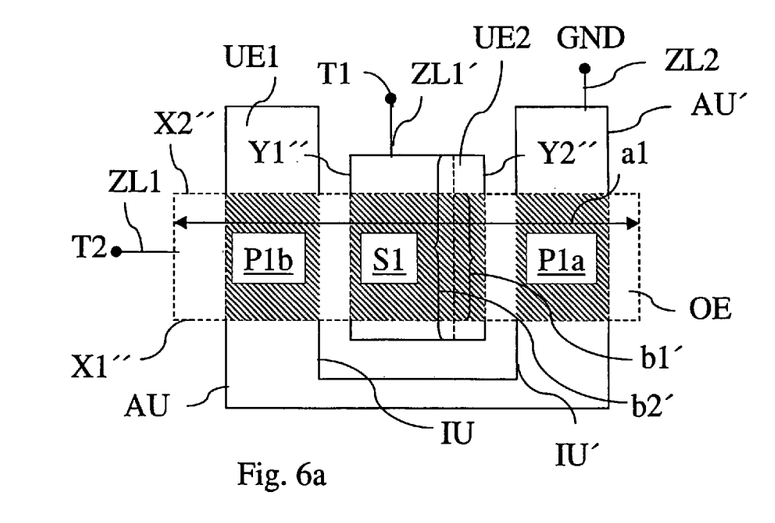
Figure 6B:
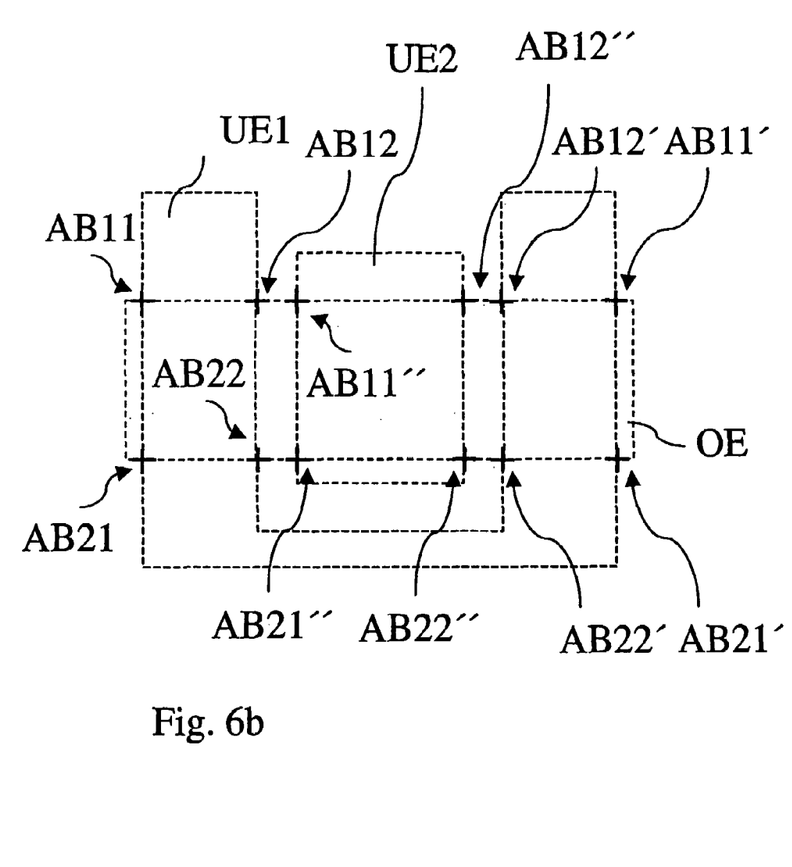
Figure 6C:
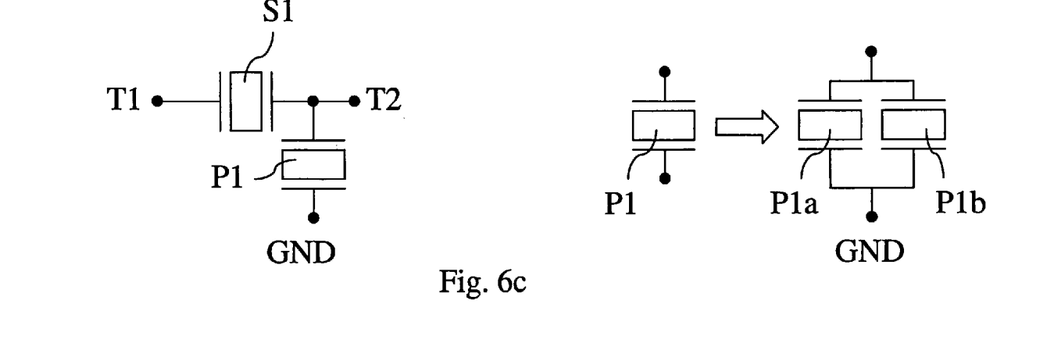
FIG. 6c shows the equivalent circuit corresponding to FIGS. 6a and 6b.

FIG. 6a schematically shows an exemplary realization according to the present invention of a basic element of a ladder-type arrangement of resonators (see also the corresponding circuit diagram according to FIG. 6c). T1 and T2 are electrical gates of the quadripole, and GND is the ground terminal. S1 is a series resonator situated in the signal line, and P1 is a parallel resonator situated in a shunt arm, made up of two partial resonators P1a and P1b that are wired parallel to one another. First U-shaped electrode UE1 and a first strip-shaped electrode UE2 are preferably designed in the same metallic layer of the component. Edges X1" and X2" of second electrode OE intersect inner edges IU and IU' and outer edges AU, AU' of electrode UE1, as shown in FIG. 5a, and also intersect edges Y1" and Y2" of strip-shaped electrode UE2, which face the inner edges of electrode UE1.

Distance a1 is always greater by the minimum value β than is the distance between the outer limits (edges AU, AU') of a first area of overlap that is made up of the partial areas of overlap corresponding to partial resonators P1a and P1b. The area of overlap of electrodes UE2 and OE is a second area of overlap, independent of the first, which is formed for example as in FIG. 1a or 2a. Distance b1' is on the one hand smaller, by the cited minimum value, in the areas P1a and P1b than is length L3 of the limbs of electrode UE1. On the other hand, distance b1' in area S1 is smaller by the cited minimum value than is length b2', measured in the Y direction, of strip-shaped first electrode UE2.

In FIG. 6b, features for obtaining the overall surface of the area of overlap composed according to FIG. 6a are explained. The edge pairs of electrodes UE1 and OE comprise, at least in the areas of crossing AB11–AB22 and AB11'–AB22', segments parallel to one another having length β. The extended parallel segments in areas of crossing AB11, AB11', AB21, and AB21' form a parallelogram. The extended parallel segments in areas of crossing AB12, AB12', AB22, and AB22' also form a parallelogram.

In order to obtain the surface of the area of overlap of electrodes UE2 and OE, it is essential that the edge pairs of electrodes UE2 and OE comprise, at least in the areas of crossing AB11"–AB22", segments parallel to one another having length β.

In all specific embodiments having a composed area of overlap, it is possible to keep the overall surface of the area of overlap constant when there is mutual shifting of the first and the second electrodes relative to one another, 1) whereby only the edges facing one another of the partial electrodes connected electrically with one another cross with an edge pair of the second electrode, whereby distance a2 between the edges facing away from one another of the partial electrodes always exceeds distance a1 between the edges facing away from one another of the second electrode by at least the defined minimum value;

2) whereby both the edges facing one another and also the edges facing away from one another of the partial electrodes connected electrically with one another cross with an edge pair of the second electrode, whereby distance a1 between the edges facing away from one another of the second electrode always exceeds the distance a2 between the edges facing away from one another of the partial electrodes by at least the defined minimum value.

In the preferred embodiments, the supply lines, not shown in most of the Figures, to first electrodes UE, UE1, UE2 and to second electrodes OE, OE1 adjoin those segments of the electrode edges that do not touch the edges of the area of overlap.

Figure 7A:
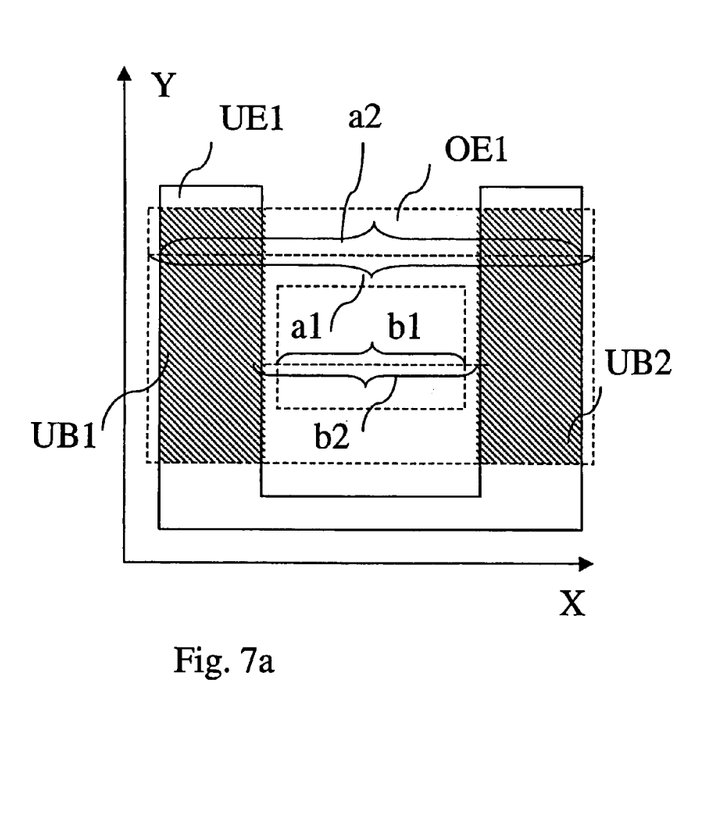
FIGS. 7a to 7d respectively show a U-shaped electrode that overlaps with an O-shaped electrode, in a schematic top view.
Figure 7B:
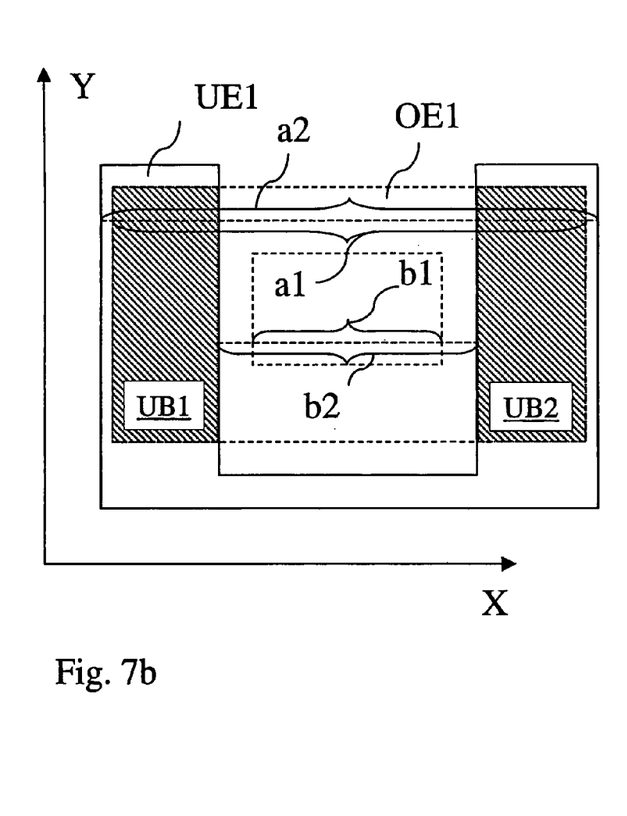
Figure 7C:
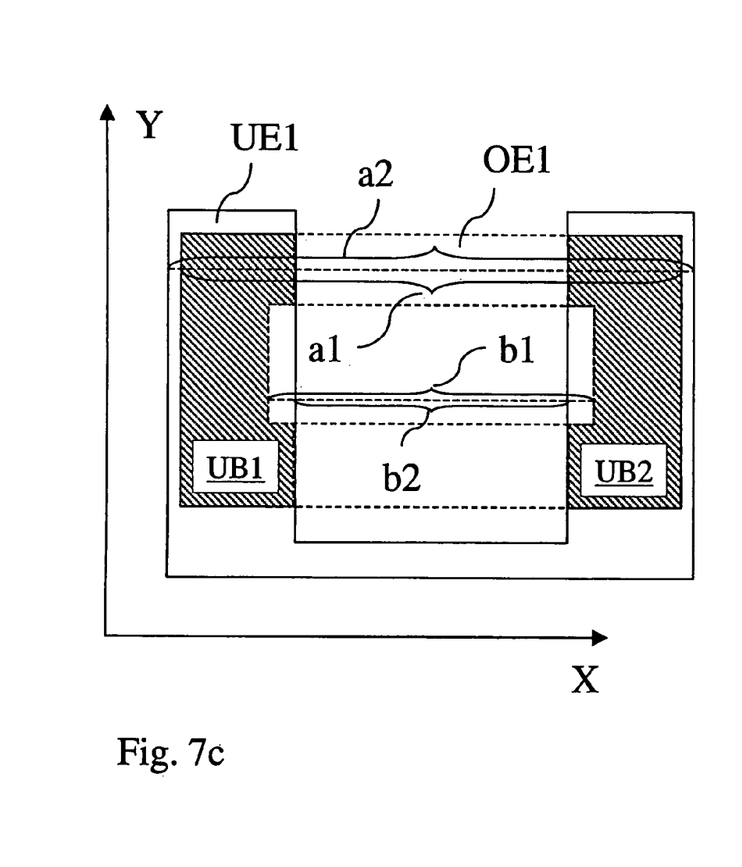

FIGS. 7a to 7c show various constructions of the overlapping U-shaped first electrode UE1 and O-shaped second electrode OE1.

FIGS. 7a and 7b each show a construction in which the inner edges, oriented along the X-axis, of the O-shaped electrode do not intersect the inner edges, oriented along the Y-axis, of the U-shaped electrode. Distance b1, measured in the X direction, between the inner edges situated opposite one another of the O-shaped electrode is thereby always smaller by at least the defined minimum value than is distance b2, measured in this direction, between the inward-facing edges of the U-shaped electrode. Under this condition, if the inner edges of the U-shaped and O-shaped electrodes do not intersect, the shape of all inner edges can be chosen arbitrarily.

FIG. 7c shows a construction of the overlapping U-shaped and O-shaped electrodes in which the inner edges of O-shaped electrode OE1 form the second edge pair, which crosses with the first edge pair, which is formed by the inward-facing edges of the U-shaped electrode. The outer edges, oriented in the X direction, of O-shaped electrode OE1 cross only with the inner edges of U-shaped electrode UE1. Distance b1 between the inner edges of the O-shaped electrode is thereby always greater by at least the defined minimum value than is distance b2, measured in this direction, between the inner edges of the U-shaped electrode.

Figure 7D:
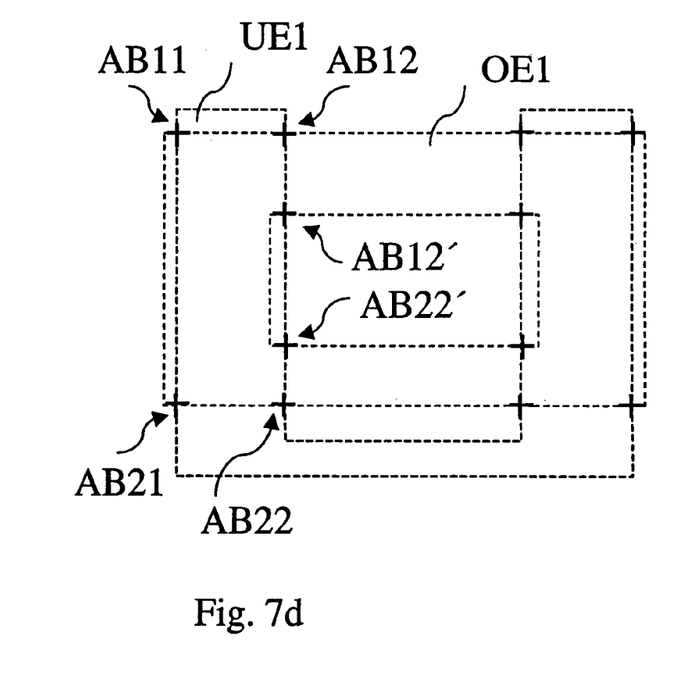

FIG. 7d schematically shows a further construction of the overlapping U-shaped and O-shaped electrodes, in which the inner edges of O-shaped electrode OE1 form the second edge there, which crosses with the first edge pair, which is formed by the inward-facing edges of the U-shaped electrode. The outer edges of O-shaped electrode OE1 form an additional second edge pair that on the one hand crosses the first edge pair and on the other hand crosses an additional first edge pair that is formed by the outward-facing edges of the U-shaped electrode.

Figure 8A:
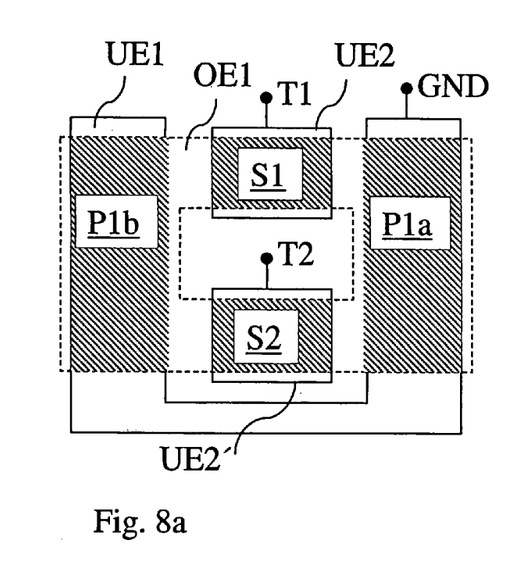
FIGS. 8a, 8b, 9 each show a U-shaped electrode that overlaps with an O-shaped electrode, in a schematic top view.
Figure 8B:
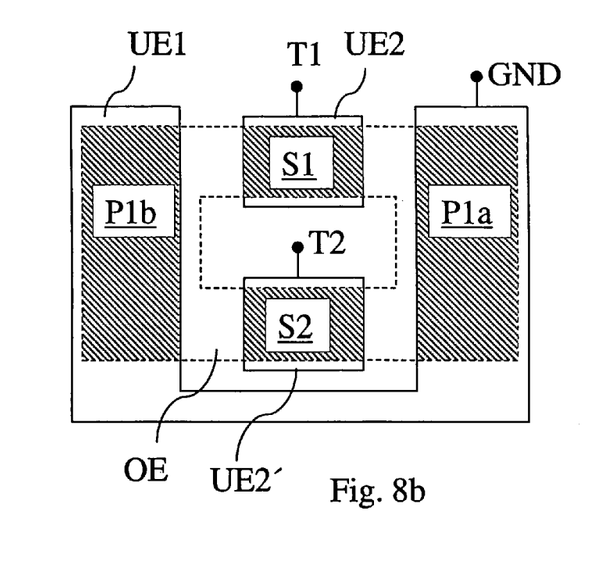
Figure 8C:
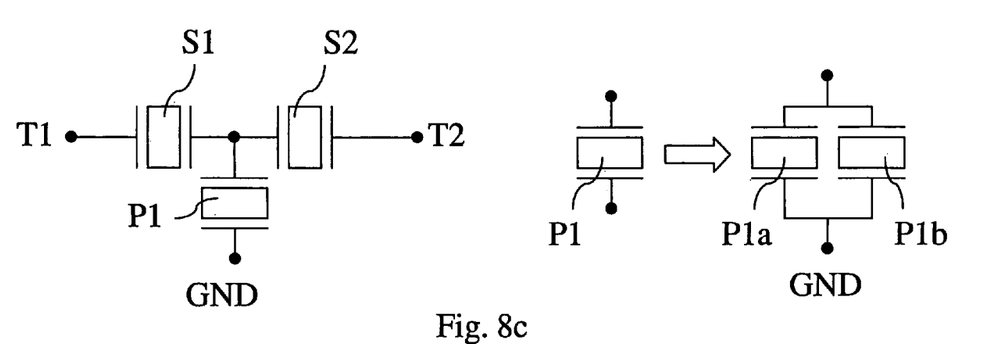
FIG. 8c shows the equivalent circuit corresponding to FIGS. 8a and 8b.

FIGS. 8a and 8b show an exemplary realization according to the present invention of a T-element or T-network of a ladder-type arrangement of resonators (see also the corresponding circuit diagram according to FIG. 8c). The T-element comprises two series resonators S1 and S2 and a parallel resonator P1 made up of partial resonators P1a and P1b. UE2' is an additional first electrode that is preferably rectangular or strip-shaped. The essential characteristics of the constructions according to FIGS. 8a and 8b have already been discussed in the description relating to FIGS. 6a to 7d.

Figure 9:
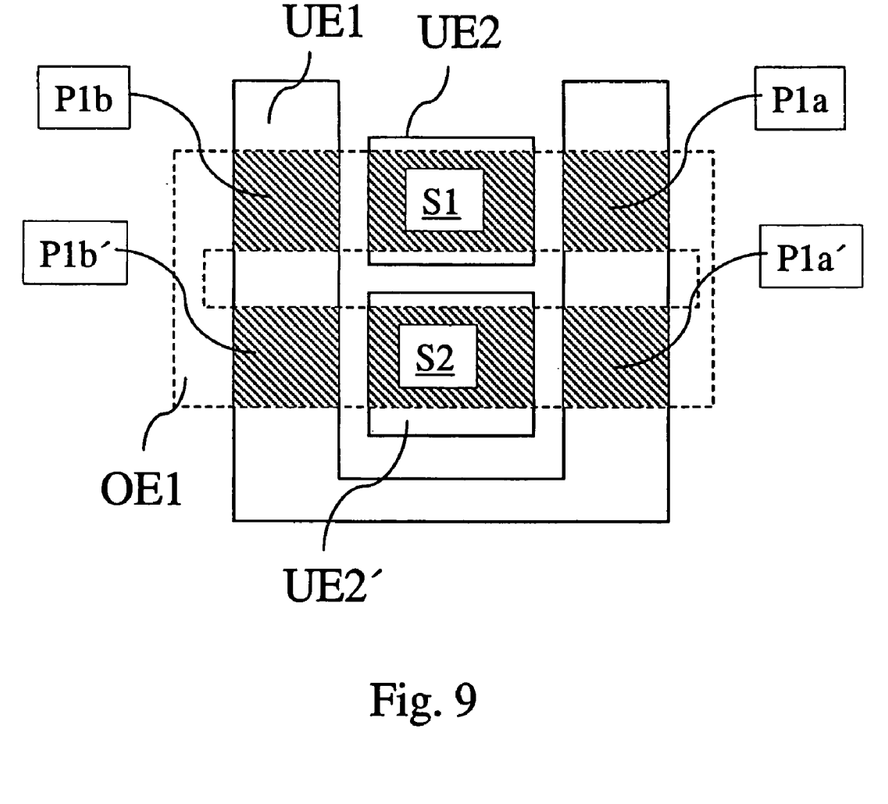

FIG. 9 indicates that it is possible, given overlapping of a U-shaped and an O-shaped electrode, to form four subareas that are separate from one another and that are each contiguous, corresponding to a parallel circuit of partial resonators P1a, P1a', P1b, and P1b'.

Figure 10A:
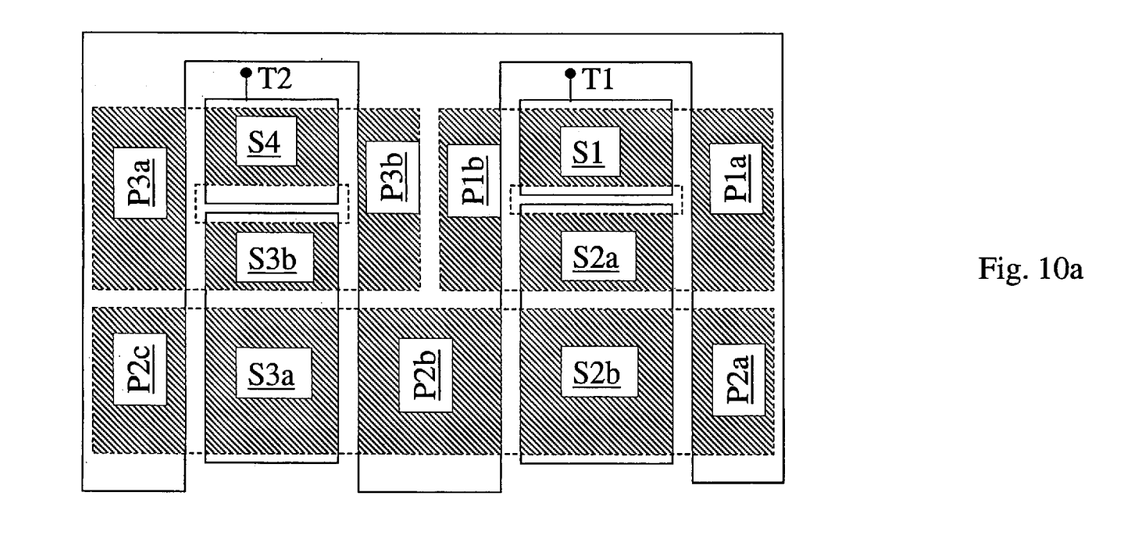
FIG. 10a shows a wiring together of resonators in a ladder-type construction.
Figure 10B:
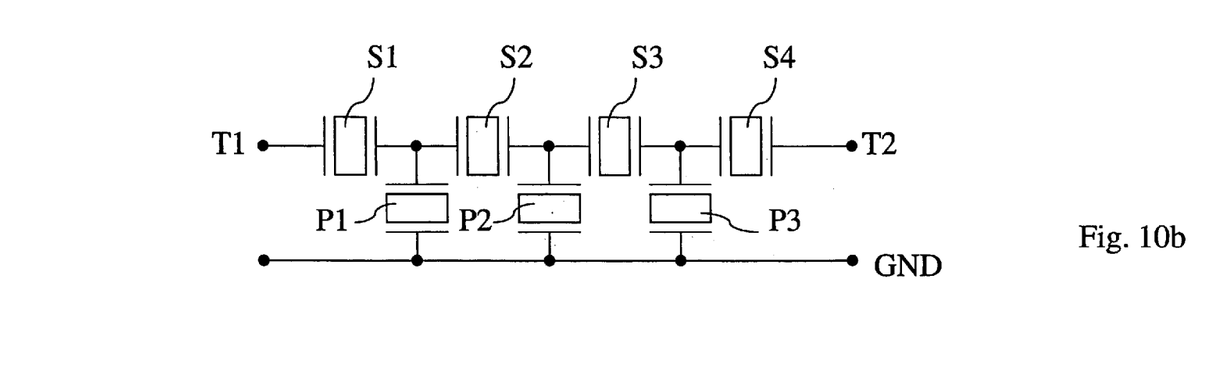

FIG. 10a shows an exemplary realization of a circuit illustrated in FIG. 10b (ladder-type arrangement s-p-s-p-s-p-s-p-s). S1 to S4 are series resonators, and P1 to P3 are parallel resonators situated in shunt arms. Resonator P1 is made up of partial resonators P1a and P1b, which are connected to one another in parallel. Resonator P2 is made up of three partial resonators P2a, P2b, and P2c, connected to one another in parallel. Resonator P3 is made up of partial resonators P3a and P3b, connected to one another in parallel. Resonator S1 is made up of partial resonators S1a and S1b, connected to one another in parallel. Resonator S3 is made up of partial resonators S3a and S3b, connected to one another in parallel. The partial resonators are formed by the areas of overlap of an E-shaped first electrode and four strip-shaped first electrodes with two O-shaped second electrodes and a strip-shaped second electrode.

The layout shown in FIG. 10a is error-tolerant and is also highly compact, because resonators or partial resonators arise solely through areas of overlap or partial areas of overlap, so that separate supply lines between the resonators can be omitted. The compact layout as shown in FIGS. 5a to 10a is given in particular by the U-shaped, O-shaped, and E-shaped constructions of the electrodes.

The distance between the electrodes that are designed in the same metallic layer and are situated closely alongside one another is preferably selected so that it does not exceed the value $\beta/2$.

The component according to the present embodiment is not limited to the depicted ladder-type structures, which begin and end with series resonators. Arbitrary numbers of $\pi$ elements can also be realized. Arbitrary combinations of T elements, L elements, and $\pi$ elements in a circuit are also possible. Serial and parallel resonators can each be made up of an arbitrary number of partial resonators. The shape of the electrodes and the number of partial electrodes connected with one another can thereby be varied arbitrarily. A known lattice-type wiring of resonators is also possible.

Intermediate layer ZS can be designed so as to be structured.

Although it has been possible to describe only a limited number of possible developments of the present invention in the exemplary embodiments, the present invention is not limited to these. It is possible to manufacture electrode pairs in an arbitrary number and shape in order to modify the characteristics of the component in a desired manner. A component is also not limited to particular materials, to the number of elements depicted, or to particular frequency ranges. It is also possible to use the underlying idea of the arbitrary waveguides, inductances, resistors, capacitors, or in optical components, such as for example lasers.

While preferred embodiments have been illustrated and described in detail in the drawings and foregoing description, the same are to be considered as illustrative and not restrictive in character, it being understood that only the preferred embodiments have been shown and described and that all changes and modifications that come within the spirit of the invention both now or in the future are desired to be protected.

We claim as our invention:

1. An electrical component, comprising:
    a number N>2 of first electrodes and the number N of second electrodes allocated to and situated above the first electrodes;
    one of the first electrodes and the second electrode allocated to the one first electrode respectively forming together an electrode pair that comprises an overlap area;
    each first electrode having at least two edges situated opposite one another forming a first edge pair;
    each second electrode having at least two edges situated opposite one another forming a second edge pair;
    the first and the second edge pairs crossing in crossing areas;
    for all N electrode pairs
        at least in the respective crossing area, the edges of the first edge pair are oriented parallel to a first preferred direction and comprise parallel segments having a length L per segment,
        at least in the respective crossing area the edges of the second edge pair are oriented parallel to a second preferred direction and comprise parallel segments having the length L per segment,
        a surface of the overlap area is invariable against a displacement of the two electrodes relative to one another by an amount $\leq \beta$, and
        along each line parallel to the first preferred direction and parallel to the second preferred direction the following holds: $|L-L'| \geq \beta$, where L' is the distance, measured in the respective direction, between the outer edges, situated opposite one another of the overlap area, and L is the distance, measured in the respective direction between the outer edges, situated opposite one another, of the electrode extending beyond the overlap area in the respective direction;
    the first electrode comprising partial electrodes connected with one another, the partial electrodes of the first electrode having inner edges facing inwardly;
    the second electrode comprising partial electrodes connected with one another, the partial electrodes of the second electrode having inner edges facing inwardly:
    b1 is a distance measured between the inner edges of the first electrode in a direction X;
    b2 is a distance measured between the inner edges of the second electrode in the direction X; and
    for the direction X and parallel to said direction $|b1-b2| \geq \beta$.

2. A component of claim 1 in which $\beta=0.4$ μm.

3. A component of claim 1 in which the first electrodes are connected with one another by first supply lines and the second electrodes are connected with one another by second supply lines, and the first and the second supply lines do not directly adjoin the edges of the respective overlap area.

4. A component of claim 1 in which an angle between the first and the second preferred direction is between 30° and 90°.

5. A component of claim 1 in which, in at least one of the electrode pairs, at least one of the electrodes comprises a plurality of partial electrodes connected with one another,
    at least one edge, allocated to the first or to the second edge pair of each partial electrode intersects at least one edge pair of the corresponding other electrode of the electrode pair,
    the intersecting edge pairs are respectively formed by two inner edges, facing one another of the partial electrodes and by edges facing one another and crossing the inner edges of the partial electrodes of the corresponding other electrode, and
    the overlap area comprises at least two partial overlap areas separate from one another and each designed continuously, and which are each formed by a partial electrode and the other electrode situated directly above it.

6. A component of claim 5 in which at least one electrode of the corresponding electrode pair is one of U-shaped, E-shaped, and O-shaped.

7. A component of claim 5 in which at least one of the first electrodes is U-shaped, the edges facing inward of the limbs of the U-shaped electrode are designed parallel at least in the crossing areas, are oriented in the second preferred direction, and together form the first edge pair, in which the outer edges situated opposite one another of the corresponding second electrode are designed parallel to one another, are oriented in the first preferred direction, and form the second edge pair, and in each direction parallel to the first preferred direction the following holds:

$|a1-a2| \geq \beta$, whereby a1 is the distance, measured in the first preferred direction, between the corresponding outer edges of the second electrode, a2 is the distance, measured in the first preferred direction, between the outward-facing edges of the U-shaped electrode, and in each direction parallel to the second preferred direction the length L3, measured in said each direction, of the limbs of the U-shaped electrode is everywhere greater by at least $\beta$ than is the length b1', measured in said each direction of the second electrode.

8. A component of claim 7 in which at least one additional first electrode is situated between the inward-facing edges of the U-shaped electrode two outer edges situated opposite one another of the additional first electrode are parallel to one another at least in the areas of intersection, are oriented in the second preferred direction and form a third edge pair, the second edge pair and the third edge pair intersect each other, and the difference between the length b2', measured in the second preferred direction of the additional first electrode and the length b1', measured in said second preferred direction, of the corresponding second electrode is at least $\beta$.

9. An electrical component, comprising:
a number N>2 of first electrodes and the number N of second electrodes allocated to and situated above the first electrodes;
one of the first electrodes and the second electrode allocated to the one first electrode respectively forming together an electrode pair that comprises an overlap area;
each first electrode having at least two edges situated opposite one another forming a first edge pair;
each second electrode having at least two edges situated opposite one another forming a second edge pair;
the first and the second edge pairs crossing in crossing areas;
for all N electrode pairs
at least in the respective crossing area, the edges of the first edge pair are oriented parallel to a first preferred direction and comprise parallel segments having a length L per segment,
at least in the respective crossing area the edges of the second edge pair are oriented parallel to a second preferred direction and comprise parallel segments having the length L per segment,
a surface of the overlap area is invariable against a displacement of the two electrodes relative to one another by an amount $\leq \beta$, and
along each line parallel to the first preferred direction and parallel to the second preferred direction the following holds: $|L-L'| \geq \beta$, where L' is the distance, measured in the respective direction, between the outer edges, situated opposite one another of the overlap area, and L is the distance, measured in the respective direction between the outer edges, situated opposite one another, of the electrode extending beyond the overlap area in the respective direction;
in at least one of the electrode pairs, at least one of the electrodes comprises a plurality of partial electrodes connected with one another;
at least one edge, allocated to the first or to the second edge pair of each partial electrode intersects at least one edge pair of the corresponding other electrode of the electrode pair;
the intersecting edge pairs are respectively formed by two inner edges, facing one another of the partial electrodes and by edges facing one another and crossing the inner edges of the partial electrodes of the corresponding other electrode;
the overlap area comprises at least two partial overlap areas separate from one another and each designed continuously, and which are each formed by a partial electrode and the other electrode situated directly above it;
at least one of the first electrodes is U-shaped, the edges facing inward of the limbs of the U-shaped electrode are designed parallel at least in the crossing areas, are oriented in the second preferred direction, and together form the first edge pair, in which the outer edges situated opposite one another of the corresponding second electrode are designed parallel to one another, are oriented in the first preferred direction, and form the second edge pair, and in each direction parallel to the first preferred direction the following holds:

$|a1-a2| \geq \beta$, whereby a1 is the distance, measured in the first preferred direction, between the corresponding outer edges of the second electrode, a2 is the distance, measured in the first preferred direction, between the outward-facing edges of the U-shaped electrode, and in each direction parallel to the second preferred direction the length L3, measured in said each direction, of the limbs of the U-shaped electrode is everywhere greater by at least $\beta$ than is the length b1', measured in said each direction of the second electrode; and the corresponding second electrode is O-shaped and is situated such that it forms with each limb of the U-shaped electrode a single contiguous partial overlap area, a length, measured in the second preferred direction, of the respective partial area of overlap is everywhere smaller by $\beta$ than is a length, measured in said second preferred direction, of the respective limb of the U-shaped electrode, and in each direction parallel to the first preferred direction the following holds:

$|b1-b2| \geq \beta$, where b1 is the distance, measured in the first preferred direction, between the corresponding inner edges of the O-shaped electrode, where b2 is the distance, measured in the first preferred direction, between the edges, facing inward, of the U-shaped electrode.

10. A component of claim 1 in which an intermediate layer is provided between the first and second electrodes, where the intermediate layer is designed as a dielectric layer.

11. A component of claim 10 in which the dielectric layer is designed as a piezoelectric layer, where the respective area of overlap forms a resonator area.

12. A component of claim 10 in which the intermediate layer comprises a plurality of sublayers.

13. A component of claim 1 wherein said inner edges of the first and second electrodes are oriented substantially in a same direction.

* * * * *